(12) United States Patent
Deng et al.

(10) Patent No.: US 6,927,636 B2
(45) Date of Patent: Aug. 9, 2005

(54) LIGHT STABILIZATION FOR AN OPTICALLY EXCITABLE ATOMIC MEDIUM

(75) Inventors: Jinquan Deng, Irvine, CA (US); Jeff D. Crockett, Fullerton, CA (US); Thomas C. English, Costa Mesa, CA (US)

(73) Assignee: Symmetricom, Inc., Beverly, MA (US)

( * ) Notice: Subject to any disclaimer, the term of this patent is extended or adjusted under 35 U.S.C. 154(b) by 146 days.

(21) Appl. No.: 10/654,155

(22) Filed: Sep. 3, 2003

(65) Prior Publication Data

US 2005/0062552 A1 Mar. 24, 2005

(51) Int. Cl.⁷ .................................................. H03L 7/26
(52) U.S. Cl. .......................................... 331/3; 331/94.1
(58) Field of Search ........................ 331/3, 94.1; 372/27, 372/21

(56) References Cited

U.S. PATENT DOCUMENTS

| | | | |
|---|---|---|---|
| 2,975,330 | A | 3/1961 | Bloom et al. |
| 4,431,947 | A | 2/1984 | Ferriss et al. |
| 5,457,430 | A | 10/1995 | English et al. |
| 6,222,424 | B1 | 4/2001 | Janssen et al. |
| 6,701,663 | B1 * | 3/2004 | Hughes et al. ............... 43/124 |
| 6,801,091 | B2 * | 10/2004 | Atsumi et al. ................ 331/3 |

OTHER PUBLICATIONS

W.J. Riley, "The Physics of the Environmental Sensitivity of Rubidium Gas Cell Atomic Frequency Standards," IEEE Transactions on Ultrasonics, Ferroelectronics and Frequency Control, vol. 39, Mar. 1992, pp. 232–240.

T. Dass et al., "GPS Clocks in Space, Current Performance and Plans for the Future," Proc. 34th PTTI Meeting, Dec. 2002, pp. 175–192.

J. Vannier et al., Canadian Journal of Physics, vol. 30, pp. 1396 (1982).

A.T. Howe, M. Davis and D. Pearson, "Optical Coatings Reap the Benefits of Telecommunications," Photonics Spectra, Aug. 2002, pp. 54–61.

* cited by examiner

Primary Examiner—Michael B Shingleton
(74) Attorney, Agent, or Firm—Brinks Hofer Gilson & Lione

(57) ABSTRACT

In an apparatus using optically excited atomic media, such as an atomic frequency standard, a source providing a controlled emission of light for exciting the $D_1$ and/or $D_2$ resonance lines of an alkali gas, such as rubidium or cesium, is controlled by an output generated by digital electronics from the light intensity signal of a light sensor for light transmitted by the alkali gas, an output for representing ambient temperature, and a light intensity-ambient temperature algorithm to substantially eliminate changes in light intensity due to light source aging for the purpose of reducing changes in temperature sensitivity of the apparatus as a function of time and the light-shift contribution to the frequency aging of the standard.

32 Claims, 3 Drawing Sheets

LIGHT STABILIZATION FOR AN OPTICALLY EXCITABLE ATOMIC MEDIUM

FIELD OF THE INVENTION

This invention relates to methods and apparatus using optically excitable atomic media, and, more particularly, to apparatus and methods for stabilizing atomic gas exciting light in microwave atomic frequency standards.

BACKGROUND OF THE INVENTION

Because modern telecommunication systems require extremely stable and accurate timing devices, atomic frequency standards have been used in such applications. For this and other applications, the overall size, operating temperature, power consumption, weight and ruggedness of the atomic standard are critical parameters.

Microwave atomic frequency standards use natural resonances within atoms to keep time since the natural atomic resonances are more stable and less sensitive to environmental effects, such as temperature, pressure, humidity, vibration, acceleration, etc., than are macroscopic oscillators like pendulums and quartz crystals. The natural atomic resonances are generally ground-state microwave hyperfine transition frequencies of the atoms in an atomic gas. This type of quantum atomic oscillator, operating at the hyperfine transition of an atomic gas, is used as a highly stable frequency reference to which the frequency of a variable frequency oscillator, such as a quartz oscillator, can be electronically locked so the high stability and relative insensitivity to environmental perturbations of such a natural atomic resonance are transferred to the quartz oscillator.

Atomic frequency standards usually comprise an electronic assembly including a voltage-controlled oscillator (VCO), and a physics package that maintains an accurate and stable VCO standard frequency on a long-term basis. The physics package and associated electronics are used to slave the VCO output to the selected hyperfine transition frequency of the quantum system, to thereby reduce frequency drift due to oscillator aging and the effects of the environment on the oscillator.

In atomic frequency standards in which the quantum system comprises a passive gas cell containing an atomic gas, such as rubidium or cesium, the physics package includes a light source, such as a plasma discharge light source or a semiconductor laser, a transparent gas cell (the resonance cell) and a photo detector for light that is transmitted through the atomic gas. The resonance cell, and sometimes the photo detector, is located in a microwave cavity, which is resonant at the hyperfine transition frequency of the atomic gas. The resonance of the microwave cavity at the hyperfine transition frequency of the atomic gas is used to maximize the effect of an injected microwave electromagnetic field on the atomic gas in the cell. The injected microwave electromagnetic field is generated by frequency multiplication and synthesis from the VCO output. The generated microwave frequency, that is approximately equal to the hyperfine transition frequency of the atomic gas in the cell, is then modulated (frequency modulation) and the microwave energy is injected into the microwave cavity.

If the atomic gas is an alkali vapor (e.g., Rb or Cs), the light that is generated by the light source includes light at one or both of the $D_1$ and $D_2$ optical atomic resonance frequencies (such light frequencies being referred to hereinafter as "D transition light"). ($D_1$ transition light is resonant with the optical transition between the $^2S_{1/2}$ state and the first $^2P_{1/2}$ optically excited state of the alkali atom, while $D_2$ transition light is resonant with the optical transition between the $^2S_{1/2}$ ground state and the first $^2P_{3/2}$ optically excited state.) In the case of rubidium (Rb), the $D_1$ transition light and $D_2$ transition light have wavelengths (optical frequencies) of 794.8 nm (377 THz) and 780.0 nm (384 THz), respectively. In the case of cesium (Cs), the wavelengths (optical frequencies) of the $D_1$ transition light and $D_2$ transition light are 894.6 nm (335 THz) and 852.3 nm (352 THz), respectively. (1 THz=$10^{12}$ Hz).

In operation, an alkali vapor, such as Rb or Cs, within the resonance cell in the microwave cavity is optically pumped by D transition light from the light source. In the absence of optical pumping, the populations of the two ground-state hyperfine levels are nearly equal. The effect of the optical pumping is to create a population difference between these levels; and, in the process of optical pumping, light is absorbed by the atoms. The microwave energy, injected into the microwave cavity at about the hyperfine transition frequency of the atomic gas, interacts with the atoms of the atomic gas that are in the ground-state hyperfine levels, inducing transitions between these levels and tending to drive the population difference to zero (i.e., equalize the populations). The optical pumping process, on the other hand, tends to maintain this population difference by the optical absorption of the D transition light. The optical pumping proceeds at the maximum rate when the difference between the injected microwave frequency and the hyperfine transition frequency of the atomic gas is zero and, as a result, the light energy absorbed by the atomic gas is maximized, and the light intensity sensed by the resonance cell photo detector is minimized. The intensity of the light that is transmitted through the atomic gas in the gas cell is sensed by the photo detector and the variation in light intensity is detected by the photo detector and used to generate a control output that locks the VCO output to the stable hyperfine transition frequency of the atomic gas.

It is well known that an alkali vapor, plasma discharge light source produces both $D_1$ and $D_2$ transition light that contains optical hyperfine components which must be removed or reduced in order to increase the efficiency of optical pumping to a practically useful value. These closely spaced, unwanted hyperfine components cannot be easily removed using conventional optical filtering; but, in the case of Rb vapor, there is a simple solution: isotopic filtering is employed instead using either (1) a separate, temperature-controlled isotopic filter cell containing $^{85}$Rb that is placed between the light source and the resonance cell, or (2) a resonance cell that combines the resonance and filter functions by adding $^{85}$Rb to the $^{87}$Rb already in the resonance cell (an integrated cell, so-called because it integrates the two functions). It should be noted that isotopic filtering removes part of the $D_1$ transition light and $D_2$ transition light, but some of the $D_1$ and $D_2$ transition light is still present after isotopic filtering and both perform the optical pumping function simultaneously.

If a semiconductor laser is used as the light source, it must operate in a single, longitudinal, transverse and polarization mode at an optical frequency (wavelength) that can be tuned to either the $D_1$ transition light wavelength or the $D_2$ transition wavelength. In this case, there are no unwanted optical hyperfine components because the laser output is a single, well-defined optical frequency (wavelength), and no optical filtering of any kind is needed.

In most applications, atomic frequency standards are used over a range of ambient temperatures, with the requirement that the temperature sensitivity (the change in the output frequency of the standard as a function of ambient temperature) be very small. Achieving this result is complicated by the fact that there are many potential contributions to the temperature sensitivity (TS) from both the electronics and the physics package of the device. (See, for example, W. J. Riley, "The Physics of the Environmental Sensitivity of Rubidium Gas Cell Atomic Frequency Standards," IEEE Transactions on Ultrasonics, Ferroelectrics and Frequency Control, Vol. 39, March, 1992, pp. 232–240).

In the case of optically pumped gas-cell atomic frequency standards, there are several mechanisms that can cause TS to change with time. One of these mechanisms is a result of the combined action of the light shift, the change of light intensity with ambient temperature, and the change over time of the light intensity from the light source.

The change in TS due to this mechanism can be expressed approximately in the following simplified way for an atomic frequency standard using an integrated resonance cell. Let I=light intensity entering the resonance cell, y=fractional frequency offset from the standard output frequency $f=\Delta f/f$ and $y_{LS}$=the change in y due to the light shift, then the two are related by a light-shift coefficient $k_{LS}$ according to the equation, $$y_{LS} = k_{LS} \cdot I$$

$$y_{LS}(T_C, T_L, T, t) = k_{LS}(T_C, T_L, T) \cdot I(T_L, T, t),$$

where $T_C$=cell-oven set-point temperature, $T_L$=lamp-oven set-point temperature, T=ambient temperature, and t=time. The dependence on ambient temperature results from: (1) the finite loop gain of the thermostats controlling the lamp and cell oven temperatures, and (2) the temperature gradients across the lamp and cell. (The crucial temperatures are those at the locations of the alkali-metal deposits in the lamp and cell, but these temperatures change with ambient temperature due to: (1) departures from the set-point values, and (2) the temperature gradients over the lamp and cell that change with ambient temperature and the fact that an alkali-metal deposit is at a different location than its corresponding oven-temperature sensor.)

During normal device operation, the set-point temperatures are not changed; i.e., $T_L$ and $T_C$ are parameters that are held constant (but the temperatures of alkali metal deposits in the resonance cell are not constant, but change with ambient temperature). In this case, the above equation can be written in simplified form as, $$y_{LS}(T, t) = k_{LS}(T) \cdot I(T, t).$$

If the ambient temperature changes from $T_1$ to $T_2$ over a time period during which the light intensity remains sensibly constant, the contribution to TS from the light shift is, $$TS_{LS}(t) = y_{LS}(T_2, t) - y_{LS}(T_1, t).$$

Next, consider what happens if after a (long) time period, $\Delta t$, there has been a change in the light intensity due, for example, to light intensity decay from the light source. The contribution to TS from the light shift in this case is, $$TS_{LS}(t+\Delta t) = y_{LS}(T_2, t+\Delta t) - y_{LS}(T_1, t+\Delta t).$$

The change in TS due to the light decay is then, $$\Delta TS_{LS} = TS_{LS}(t + \Delta t) - TS_{LS}(t)$$

$$= k_{LS}(T_2) \cdot [I(T_2, t + \Delta t) - I(T_2, t)] -$$

$$k_{LS}(T_1) \cdot [I(T_1, t + \Delta t) - I(T_1, t)],$$

which is generally non-zero since the light shift coefficient at $T_1$ ambient is not the same as the light shift coefficient at $T_2$ ambient and the light intensity is not constant over long periods of time.

It follows from the last equation that if $I(T, t+\Delta t)=I(T, t)$ at all values of T, then $\Delta TS_{LS}=0$, even though the light intensity is still allowed to vary with ambient temperature. To put it another way, if $I_0(T)=I(T, t)$ is known and stored, and if at all later times t', the table I(T, t') can be made equal to the original table, $I(T, t')=I_0(T)$, then the TS due to the light shift will not change with time. To put it still another way, if the light intensity of the light source varies with ambient temperature, I=I(T), then this will generally result in a non-zero contribution to the temperature sensitivity of the standard due to the light shift effect; i.e., $TS_{LS} \neq 0$. As long as I(T) doesn't change with time, then whatever the value of $TS_{LS}$ is, it will stay the same; i.e., the only way the temperature sensitivity due to the light shift can change with time is if the light intensity itself changes with time.

(For an atomic standard using a separate isotopic filter cell instead of an integrated cell, it can be seen that, (1) the above equations still apply if the argument "$T_C$" is replaced by the arguments "$T_R, T_F$" where $T_R$=non-integrated resonance cell set-point temperature and $T_F$=filter cell set-point temperature, and (2) the above conclusions are unchanged.)

Stabilization of the light intensity from electrodeless discharge lamps has been taught in the prior art, a brief description of which follows.

U.S. Pat. No. 2,975,330 (Bloom & Bell, 1961) describes the use of a light pipe and a photocell to detect light from an alkali-metal electrodeless discharge lamp for the purpose of stabilizing the light intensity. The signal from the photocell is electronically processed and fed back to control the output power of the rf oscillator producing the discharge.

U.S. Pat. No. 4,431,947 (Ferris & Shernoff, 1984) describes the intensity stabilization of 254 nm (ultraviolet) light intensity from a mercury electrodeless discharge lamp, an arrangement similar to that of Bloom & Bell, but with the addition of an optical bandpass filter. The optical filter allows only 578 nm to pass so the intensity of 578 nm (green) light is directly stabilized whereas additionally, due to the properties of the photo detector and the discharge, the 254 nm light intensity is indirectly stabilized.

In both of the above patents, the light from an electrodeless discharge lamp was stabilized by directly sensing it using a photo detector whose electrical output was then used to control the power output of the rf oscillator that produced the discharge. Neither of these older methods is presently satisfactory because they require an additional photo detector (for sensing the light directly at the output of the light source).

In today's subminiature gas-cell standards, it is more difficult to control the temperature of the light source and the gas cell because the small size of the standard tends to reduce the amount of thermal insulation between the light source and gas cell and the outside ambient temperature. If this causes the light source to experience significant temperature change when the ambient temperature changes, then the light-shift contribution to TS, and $\Delta TS$ as well, will not be negligible.

The purpose of this invention is to greatly reduce the size of $\Delta TS$ by stabilizing the light intensity of the light source in the presence of aging and varying ambient temperature, thereby making $I(T, t+\Delta t)-I(T, t)\approx 0$ at all values of ambient temperature. While the effect of this improvement is to make $\Delta TS\approx 0$, there is still a light shift contribution to TS, but now this contribution does not change significantly with time.

SUMMARY OF THE INVENTION

The invention provides, in its best mode, a simple method of, and apparatus for, stabilizing the light intensity of the light source for an optically excited atomic medium over time and a range of ambient temperatures. For example, in a small, passive, gas-cell atomic frequency standard, light intensity is stabilized in such a way that the temperature sensitivity (TS) of the standard is prevented from changing with time. The invention also reduces to a negligible amount the contribution of the light shift to frequency aging (otherwise, long-term changes in light intensity due to light source aging cause frequency aging of the standard via the corresponding change in the light shift). Finally, in the case of a plasma discharge light source, the invention also provides a significant improvement in the short-term frequency stability (Allan variance) of the standard.

Atomic frequency standards of the invention include means for providing a controlled emission of D transition light for direction through and excitation of an atomic gas, (such as Rb or Cs vapor) carried in a resonance cell. Such means can include either an electrodeless plasma discharge light source or a semiconductor laser light source. The intensity of the D transition light that is transmitted by the atomic gas is sensed by a light sensor on the light output side of the resonance cell and converted into a light intensity signal, and an input related to the ambient temperature that may affect the intensity of the D transition light from the light source is generated. A voltage reference signal representing the light intensity signal as a function of ambient temperature is generated and stored for use. The light intensity signal, ambient temperature-related input and stored reference voltage are used to correct the controlled emission of D transition light for light intensity aging of the uncontrolled light.

By sensing the D transition light transmitted by the atomic medium and providing a light intensity signal, providing an input that represents the ambient temperature that may affect the intensity of the D transition light generated by the means for providing a controlled emission of D transition light, generating a reference signal representing the light intensity signal as a function of ambient temperature, and using the input signal that is representative of ambient temperature, the light intensity signal and the reference signal to control the means for providing a controlled emission of D transition light, the intensity of the D transition light of an apparatus can be rendered free of the effects of light intensity aging.

To better understand the importance of the invention, note that when the ambient temperature changes the temperatures of both the lamp and resonance cell, alkali metal deposits change.

Consider first, for example, the change in resonance cell alkali metal deposit temperature in atomic frequency standards using an electrodeless plasma discharge lamp as the source of D transition light, assuming there is no lamp alkali metal deposit temperature change (and assuming that the lamp oscillator is designed so that its temperature change does not affect the light output of the lamp). Since there is no lamp alkali metal deposit temperature change, the light intensity entering the cell remains constant as the ambient temperature changes, but the intensity of the light leaving the cell, that is incident upon the photo detector, varies with ambient temperature because the vapor density of the atomic gas light absorber in the cell depends strongly on the cell alkali metal deposit temperature. If the lamp light intensity decreases over time (unstabilized case), then the intensity of the light leaving the cell will also decrease over time, but not proportionally. On the other hand if, for a particular value of ambient temperature, the lamp set-point temperature is increased so as to maintain the original value of light intensity leaving the cell, then the light intensity entering the cell will remain unchanged (stabilized case). If the original values of light intensity leaving the cell are known for all ambient temperatures of interest, then the lamp light intensity can be stabilized over time regardless of the ambient temperature.

Finally, consider the case where the lamp alkali metal deposit temperature also changes with ambient temperature. The light intensity from the lamp, instead of being constant, will now be a function of ambient temperature: $I=f(T)$. Using the same stabilization method as for the previous case, $I=f(T)$ is maintained over time, even when lamp light decay is present. Therefore, the light shift as a function of ambient temperature is maintained sensibly constant in time. This results in $\Delta TS_{LS}\approx 0$ as in the invention.

Thus, with the invention, the intensity of the D transition light will be stabilized in time, even though it still changes with ambient temperature, $I(T, t+\Delta t)$ will equal $I(T, t)$, and the light-shift contribution to $\Delta TS$ will therefore be negligible; i.e., there will be no change in $TS_{LS}$ with time (even if there is significant light intensity aging).

DETAILED DESCRIPTION OF A PREFERRED EMBODIMENT AND MODE OF THE INVENTION

The following more detailed description of the invention relates to currently preferred atomic frequency standard embodiments and modes of invention. The embodiment elements and features that are described below are intended to exemplify but not limit the invention.

Figure 1:
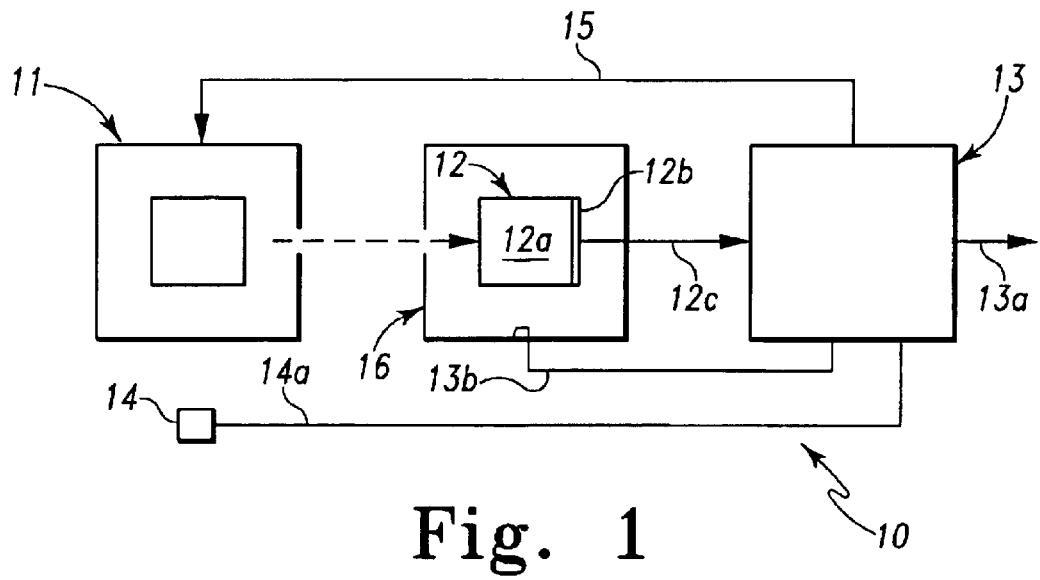
FIG. 1 is a simplified block diagram of an atomic frequency standard for explanation of the invention.

FIG. 1 is a very simplified block diagram to assist in the explanation of the invention. As illustrated by FIG. 1, one embodiment 10 of the invention can comprise a means 11 for providing a controlled emission of D transition light for activating an atomic gas, such as Rb or Cs; a microwave cavity 16, which is excited by microwave energy, and which includes a resonance cell 12 for the atomic gas 12a to be activated by the light from means 11, and a photosensor 12b; and an electronic assembly 13 for generating a standard frequency 13a that is controlled to remain constant, and the microwave energy 13b for exciting the microwave cavity 16.

As explained in greater detail below, in the invention, the light from the means 11 includes substantially only the D transition light that is selected for activation of the atomic gas 12a. The D transition light is directed from the means 11 through the atomic gas 12a in the gas cell 12, and the D transition light that is transmitted by the atomic gas 12a is detected by the photo sensor 12b to provide a transmitted light signal 12c. The electronic assembly 13 generates the standard frequency output 13a, and from the standard frequency 13a, a microwave frequency output 13b substantially equal to the hyperfine transition frequency of the atomic gas 12a, which is frequency modulated at an audio frequency and injected into the microwave cavity 16.

As is well known in the art, the atomic gas in gas cell 12a is optically pumped by the light from means 11, and the microwave energy output 13b injected in the microwave cavity 16 is varied about the hyperfine transition frequency, interacts with the optically pumped atoms of atomic gas 12a and varies the intensity of the light transmitted through the atomic gas 12a depending upon the frequency of the microwave frequency output 13b, with a minimum of light being transmitted by the atomic gas 12a when the injected microwave frequency equals the hyperfine transition frequency of the atomic gas 12a. Thus, the intensity of the transmitted light that is sensed by photosensor 12b and the resulting transmitted light output signal 12c is an audio frequency modulated signal whose first harmonic is minimal when the microwave frequency output 13b that is the input to the atomic gas 12a in gas cell 12, is at the hyperfine transition frequency, and the frequency modulated signal is used by the electronic assembly 13 to slave the standard frequency output 13a to the hyperfine transition frequency of the atomic gas 12a and prevent its variation.

In the invention, the means 11 for providing a controlled emission of D transition light is controlled by an output 15 from the electronic assembly 13. The electronic assembly 13 includes a light intensity variation algorithm relating the D transition light intensity output of the means 11 to ambient temperatures that may affect the D transition light intensity emitted by the means 11, and an input signal 14a representative of ambient temperatures that may affect the D transition light intensity of the means 11, and the electronic assembly 13 generates therefrom the output 15 that controls the means 11 to substantially eliminate variations in the intensity of the D transition light output of the means 11 due to light intensity aging.

Figure 2:
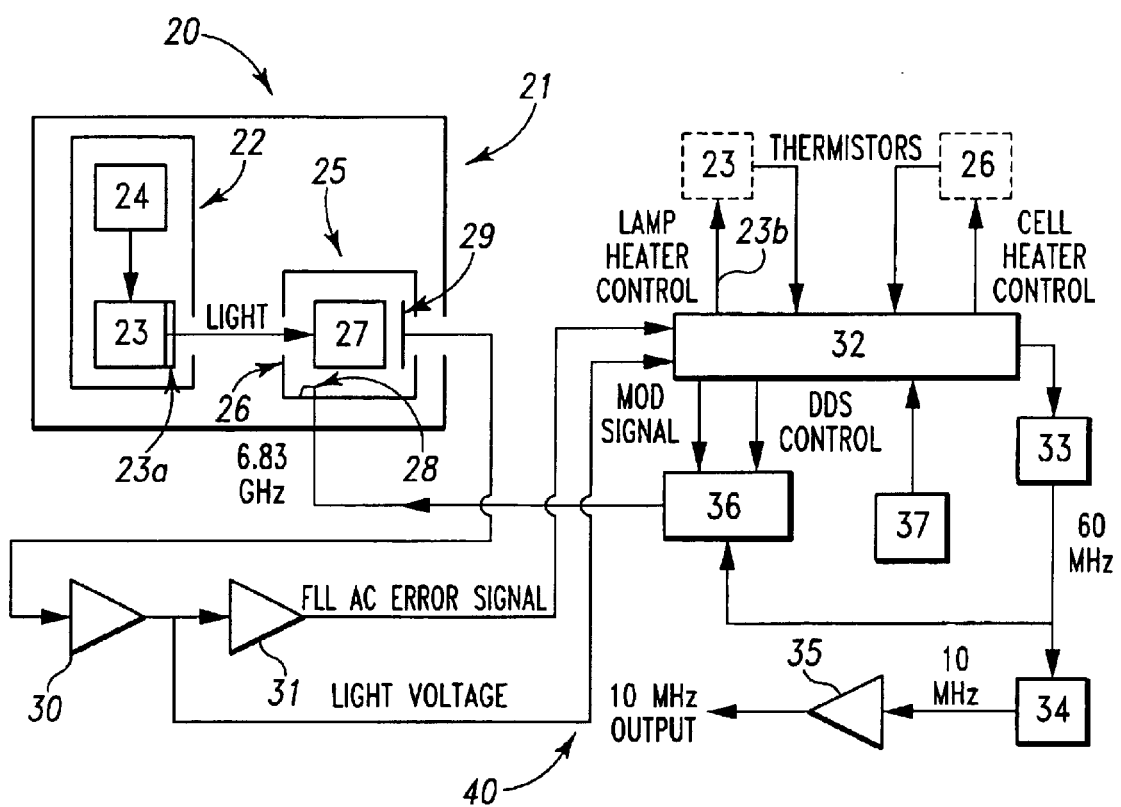
FIG. 2 is a block diagram of one preferred embodiment of the invention with a plasma discharge light source.

A detailed schematic diagram of a preferred atomic frequency standard of the invention that includes an electrodeless plasma discharge light source is included in FIG. 2. As illustrated in FIG. 2, the standard 20 consists of physics package 21, with the remainder of the device being an electronic assembly 40. The physics package contains a means 22 for providing a controlled emission of D transition light and a resonator package 25. The embodiment described below uses rubidium vapor as the atomic gas, but other atomic gases, such as cesium, may also be used (at least in principle, if not in practice).

The means 22 consists of lamp oven 23 containing a glass bulb (not shown) filled with a small amount of rubidium (Rb) metal and a low pressure of xenon (Xe) gas and an optical interference filter 23a, which is bonded to the front of the lamp oven 23. The lamp oscillator 24 generates radio-frequency energy at approximately 150 MHz that is coupled into a coil (not shown) inside the lamp oven that surrounds the lamp bulb. The rf energy produces an electrodeless plasma discharge inside the lamp bulb that generates light including the D transition light desirable for exciting the rubidium gas.

The resonator package 25 consists of a microwave cavity 26 that also functions as an oven to heat the resonance cell 27. The microwave cavity 26 is tuned to the hyperfine transition frequency of $^{87}$Rb at approximately 6.84 GHz. The resonance cell 27 is a glass cell that contains Rb metal and buffer gas (e.g., nitrogen gas). Also contained inside the microwave cavity is a photodiode 29. Present in an actual atomic frequency standard, but not shown in the FIG. 2 diagram, is the C-field and magnetic shields, which are well known to those skilled in the art.

The light from means 22 passes through the optical filter 23a which allows a significant intensity of D transition light into the resonator package 26 and substantially attenuates other unwanted light, especially the light emitted by the buffer gas in the lamp. The D transition light enters the resonance cell 27 where it optically pumps the $^{87}$Rb atoms in the vapor. Some of the D transition light is absorbed during the optical pumping process and the remainder, the transmitted D transition light, passes through the cell 27 and is incident upon the photodiode 29 where it is converted into a photocurrent. The photocurrent leaves the physics package 21 and passes into the photo preamp 30 where it is converted into a voltage (the "light voltage") that is proportional to the D transition light intensity impinging upon the photodiode 29.

Microwaves at 6.8 GHz are produced by the multiplier chain and direct digital synthesizer (DDS) 36, and injected into the microwave cavity 26 via microwave loop 28. The input to the multiplier chain is the output of the 60 MHz voltage-controlled crystal oscillator (VCXO) 33. When the frequency of the microwaves is equal to the $^{87}$Rb hyperfine frequency at 6.834 . . . GHz, the absorption of light from the light beam is maximized so that the light transmitted by the resonance cell 27 is a minimum. This phenomenon provides a method of detecting when the microwaves are at the $^{87}$Rb hyperfine frequency and allows the stabilization of frequency generated by VCXO 33 and the microwave frequency.

The stabilization is conveniently and efficiently carried out by frequency modulating the microwave output of DDS 36 at an audio rate (e.g., modulation frequency=150 Hz). This modulation, via its effect on the injected microwave frequency and optically pumped atomic gas modulates the transmitted light and produces a modulated signal from the photodiode 29 that is amplified by a bandpass filter 31. This analog signal is passed to the digital electronics 32 where it is converted to a digital signal, demodulated to produce a digital error signal, and then converted to an analog, slowly-varying dc error signal. The analog error signal is then used to control the frequency of the VCXO 33 thereby stabilizing it by locking it to the very stable reference frequency provided by the $^{87}$Rb ground-state hyperfine-transition frequency at 6.834 . . . GHz (the $^{87}$Rb clock transition frequency). This type of servo loop is the digital version of a "frequency-locked loop" (FLL).

The digital electronics block 32 may contain any or all of the following components: a digital signal processor (DSP), a field-programmable gate array (FPGA), ADCs, DACs, multiplexers (MUXs), and various types of electrical memory (e.g., EEPROM, EPROM and SRAM). Its main purpose is to implement the FLL in digital form, thereby eliminating bulky electronic components (especially integrator capacitors) and improving performance. The electronic assembly 32 also provides secondary servo loops that are used to control the temperatures of the lamp oven 23 and cell oven 26 and provides digital temperature compensation in conjunction with the ambient temperature sensor 37

(mounted at a location inside the atomic frequency standard that reliably senses ambient temperature changes, which may be on one of the circuit boards). To avoid confusion in showing the secondary servo loops in FIG. 2, the lamp oven 23 and cell oven 26 are also depicted by the dashed line boxes located above electronics block 32.

This architecture may be used to implement the light intensity stabilization invention.

The purpose of the optical interference filter 23a is to allow the intensity of the D transition light to be controlled because this is the light that produces the light shift. The light from the lamp contains both D transition light and unwanted light. The unwanted light consists mostly of light emitted by the buffer gas in the lamp. There is also a small contribution to the unwanted light from non-D transition light emitted by the alkali vapor. The unwanted light is undesirable because it produces a negligible light shift. As the lamp package ages, the intensities of the D transition light and the unwanted light change by different amounts. Thus, controlling the total light intensity (D transition light+ unwanted light) does not stabilize the light shift, but controlling only the intensity of the D transition light does stabilize the light shift.

The optical interference filter 23a may be custom-made, but is inexpensive when used in large quantities. It consists of a glass substrate coated with various thicknesses of refractory metal oxide films. (See, for example, A. T. Howe, et al., "Optical Coatings Reap the Benefits of Telecommunications," Photonics Spectra, August 2002, pp. 54–61.) Either a bandpass filter (BP) or a short-wave-pass filter (SWP) can be used to substantially attenuate unwanted light so that the light entering the resonance cell is almost entirely is D transition light.

In the embodiment of FIG. 2, in which the plasma discharge light source employs rubidium with xenon as buffer gas, for example, a short-wave-pass (SWP) filter is used which substantially attenuates unwanted light, but does not significantly attenuate D transition light. The advantage of a SWP filter is lower cost. The filter specifications are transmission T>90 percent for the D transition light of the $D_1$ and $D_2$ lines at wavelengths of 794.8 nm and 780.0 nm, respectively; T<15 percent at wavelength of 823 nm; and average T<1 percent for the light at wavelengths from 827 nm to 1100 nm.

In addition to the D transition light, the Rb light includes weak red light at wavelengths of 621, 630 and 741 nm, and weak violet light at wavelengths of 420 and 422 nm. These weak lights are not blocked by the SWP filter, but their intensity after detection by the photodiode (i.e., including its spectral response) provides only about three percent of the total light voltage of the D transition light. Since the strong and unwanted wavelengths of the Xe light are in the region 823 nm to 992 nm, all these light wavelengths are strongly attenuated by the SWP filter.

In addition, with the resonance cell removed, the combined intensity of the unwanted Xe light prior to filtering, but after detection by the photodiode, would amount to about 50 percent of the total light voltage from the lamp. With the resonance cell present, the amount of detected Rb light is reduced because of light absorption by the Rb atoms in the cell; and, in this case, approximately 85 percent of the light voltage would be due to unwanted Xe light. Thus, with the SWP filter present in a normally operating standard, the strong and unwanted wavelengths of the Xe light are strongly attenuated, and the resulting light voltage is reduced by more than a factor of six with minimal change in the physics package discriminator slope. This gives an improvement of about a factor of 2.5 in the short-term frequency stability (Allan deviation) if the standard is operating in the shot-noise limit. (See also, T. Dass, et al., "GPS Clocks in Space: Current Performance and Plans for the Future," Prog. $34^{th}$ PTTI Meeting, December 2002, pp. 175–192.)

Thus, as set forth above, in the embodiment of FIG. 2 where the electrodeless plasma discharge light source employs rubidium with a xenon buffer gas, a SWP filter is preferred because (1) it costs less and can significantly attenuate the unwanted Xe light, which has wavelengths significantly longer than those of the D transition light; i.e., in excess of 823 nm, and (2) the non-D transition light generated by the plasma discharge light source with wavelengths shorter than the D transition light has no significant effect on the resonance cell light intensity signal. Where, however, an electrodeless plasma discharge light source may employ gases other than rubidium and xenon, its light output may include unwanted light with wavelengths above and/or below the wavelengths of the D transition light, and a bandpass or other filter may be required to substantially attenuate the unwanted light while substantially passing D transition light.

In FIG. 2, the SWP filter 23a is shown directly mounted on the front of the lamp oven 23, but it could just as well be mounted on the front of the cell oven 26 (both temperature-controlled surfaces). Silicone-rubber adhesive is, preferably, used for mounting. Since the filter uses very stable refractory oxide coatings, it is able to operate without degradation at the high temperatures encountered in Rb lamp operation (115° C.). Moreover, since the temperature coefficient of wavelength of the filter is very small, it can also be mounted on a surface that is not temperature controlled if this is desirable for other reasons.

In the invention, the electronic assembly 40 uses (1) a light-intensity ambient-temperature algorithm for ambient temperatures that may affect the intensity of D transition light emitted by means 22, (2) an input representing ambient temperature (such as the signal generated by an ambient temperature sensor 37) and (3) the light voltage, to generate an output 23b to control the temperature of the lamp oven 23 and the intensity of the D transition light emitted from means 22 to substantially eliminate the effects of D transition light intensity aging.

Those skilled in the art will recognize that the digital electronics 32 inputs (light voltage, lamp oven temperature and ambient temperature) and output (lamp oven heater control) used in the invention are already usually present in atomic frequency standard electronic assemblies.

In another preferred embodiment of the invention, an ambient temperature sensor 37 is not used; cell-oven heater power, as determined by the digital electronics 32, is used as a representation of ambient temperature to correct for variations in light intensity.

To generate an algorithm, or table, of reference light voltages as a function of ambient temperature, a new atomic frequency standard is placed in an environmental chamber, and the light voltage and cell-oven heater power are measured for a number of selected ambient temperatures covering the range of ambient temperatures over which the standard will operate. Preferably, from a fit to the data, a polynomial representation of light voltage ($V_{ref}$) as a function of cell-oven heater power (P) is obtained and stored in a memory of the digital electronics 32.

During normal operation of the standard, the light voltage V and the cell-oven heater power are monitored and $V_{ref}(P)$ is computed from the stored polynomial. The quantity $\Delta V = V - V_{ref}$ is then used as an error voltage to adjust the lamp oven temperature so that $\Delta V$ is essentially zero. The response (sampling) time of the process can be made very slow because the light intensity changes due to lamp package aging occur over relatively long periods. This last step is carried out electronically by altering the existing lamp oven set-point temperature until $\Delta V \approx 0$.

In one operation of the invention, for example, if the light from the lamp decreases by 5 percent, the lamp oven temperature must be increased by about 1° C. to bring the light voltage back to its value before the decrease. With proper design [U.S. Pat. No. 5,457,430 (English et al., 1995)] the light decay from the lamp over the lifetime of the standard is not expected to exceed about 10 percent, so that only about a 2° C. increase in lamp temperature would be required to stabilize the lamp light intensity.

This embodiment of the invention thus provides a method of stabilizing the intensity of the D transition light of a plasma discharge light source by substantially attenuating unwanted light frequencies while insubstantially attenuating the D transition light generated by the plasma discharge light source, sensing the intensity of the D transition light that is transmitted by the atomic gas and generating therefrom a transmitted light signal, providing an input signal that represents the ambient temperatures that affect the intensity of the D transition light, providing an algorithm relating intensity of the transmitted D transition light to ambient temperature, and using said transmitted light signal, said input signal and said algorithm to vary the set-point temperature of the plasma discharge light source to correct for effects of light intensity aging.

Figure 3:
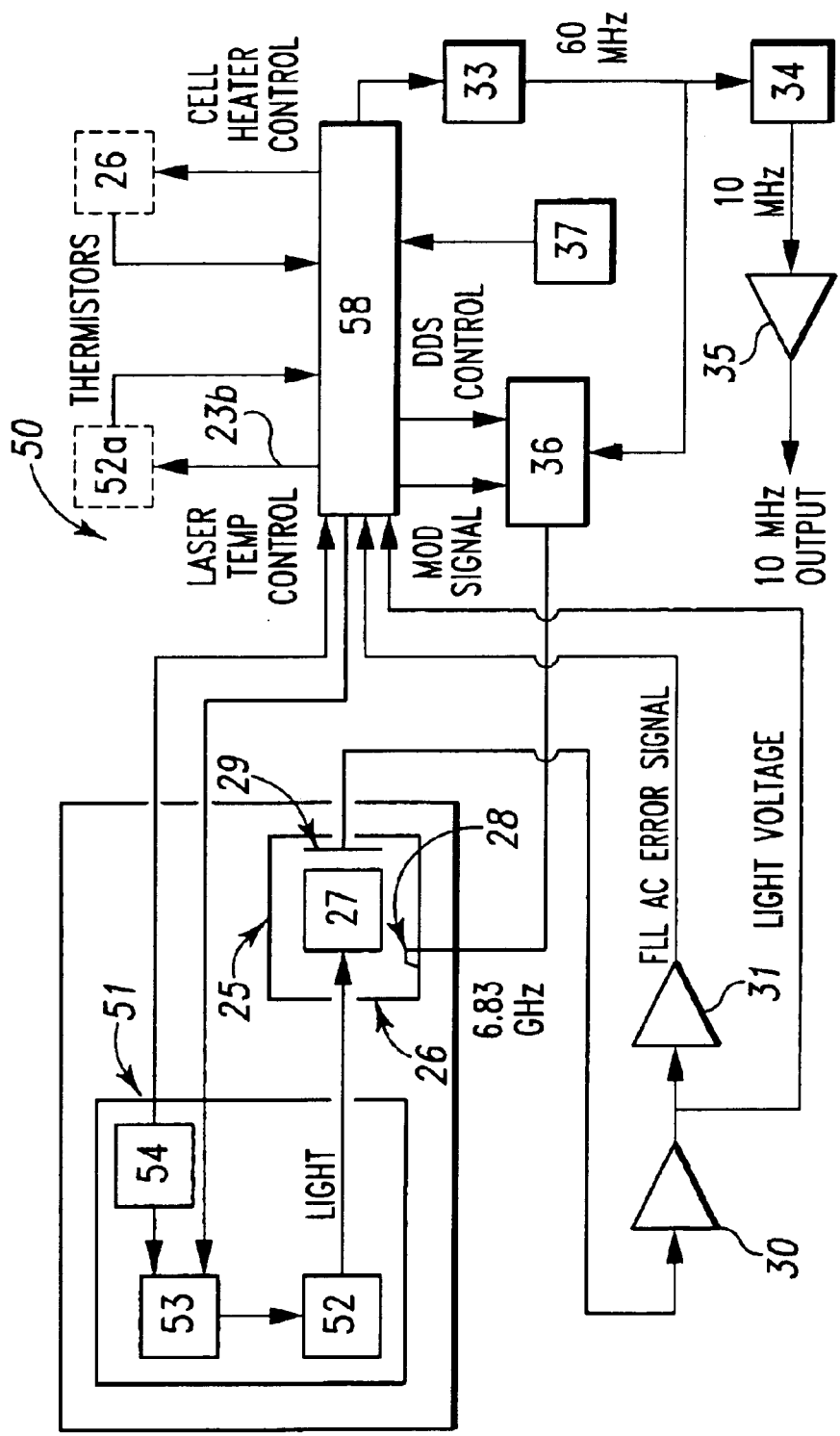
FIG. 3 is a block diagram of a preferred embodiment of the invention with a semiconductor laser light source.
Figure 4:
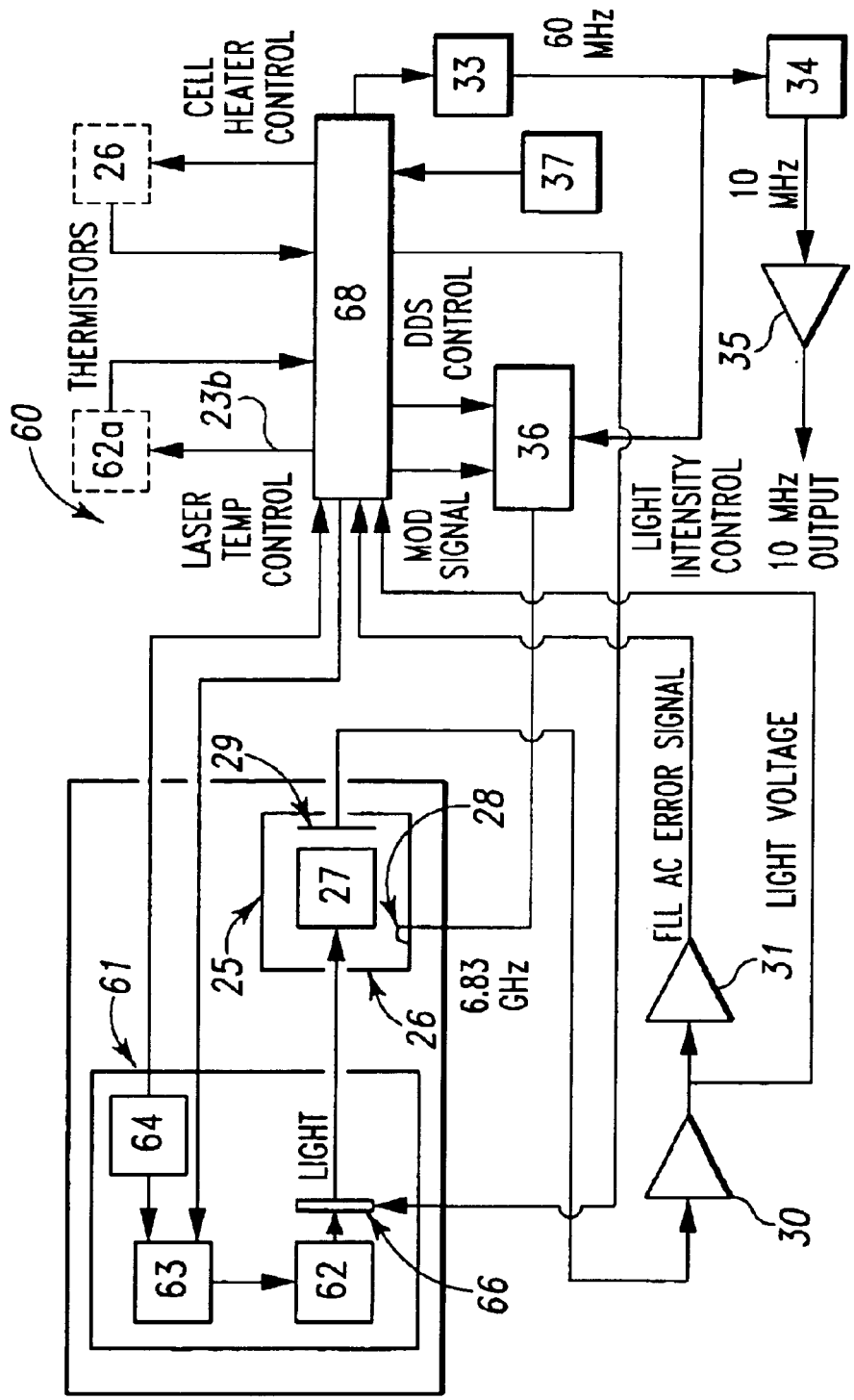
FIG. 4 is a block diagram of another preferred embodiment of the invention with a semiconductor laser light source.

FIG. 3 and FIG. 4 are detailed schematic diagrams of embodiments of the invention in which the means for providing a controlled emission of D transition light uses a semiconductor laser as its light source. FIGS. 3 and 4 are similar to FIG. 2 except for those differences by which the D transition light is generated and controlled in the invention. Accordingly, the description below will center on the differences in the means for providing a controlled emission of D transition light and in the electronic assembly.

Since in the FIG. 3 and FIG. 4 embodiments a semiconductor laser is used as the light source in the means for providing a controlled emission of D transition light, its optical frequency output (light wavelength) must coincide with the optical resonance frequency (wavelength) of one of the $D_1$ or $D_2$ resonance frequencies of the rubidium or cesium atomic gas used in the gas cell. The frequency of the light output of a semiconductor laser can be controlled by suitable selection of the laser injection current and/or laser temperature, and the light output of a semiconductor laser is generally free of unwanted light. The laser injection current can be selected and controlled by an injection current supply for the laser, and the laser temperature can be controlled by a heater or thermoelectric device in heat transfer relationship with the laser.

In both the means 51 for providing a controlled emission of D transition light of the embodiment 50 of FIG. 3, and the means 61 for providing a controlled emission of D transition light of the embodiment 60 of FIG. 4, the semiconductor lasers, 52 and 62, respectively, are locked to one of the optical resonance frequencies of the $D_1$ or $D_2$ resonance lines as follows.

Laser injection current is supplied by an injection current supply, 53 or 63 respectively. The injection current consists of a dc component and a smaller ac component. The ac component is provided by a laser modulation source, 54 or 64, respectively, whose frequency, for example, $\approx 10$ kHz. The amplitude modulation of the laser injection current produces a modulated laser light that also has an ac component at the laser modulation frequency. The modulated laser light is incident on resonance cell 27, and the light that is transmitted through resonance cell 27 and impinges on photodiode 29 varies in intensity at the laser modulation frequency and is converted to a photocurrent that has an ac component at the laser modulation frequency. The ac photocurrent is converted into an ac voltage by photo preamp 30 and amplified by amplifier 31. The output of amplifier 31 is fed into the digital electronics 58 or 68 where it is processed by synchronous demodulation at the laser modulation frequency to produce a quasi-dc error signal proportional to the difference, positive or negative, between the laser frequency and the frequency of the $D_1$ or the $D_2$ resonance line. This error signal is then processed by a digital integrator whose output is converted to an analog signal using a digital to analog converter. Both the digital integrator and the digital to analog converter are included in digital electronics 58 or 68. The analog signal is then fed from the digital electronics to the injection current supply, 53 or 63, respectively, where it either increases or decreases the dc injection current so as to move the laser frequency to the center frequency of the $D_1$ or the $D_2$ absorption line.

Thus, in both the FIG. 3 and FIG. 4 embodiments, the semiconductor lasers 53, 63 are controlled as set forth above, to maintain the emitted D transition light at one of the $D_1$ resonance frequency or the $D_2$ resonance frequency.

Description of the differences of the means for providing a controlled emission of D transition light, 51 and 61, respectively, of the embodiments of FIG. 3 and FIG. 4 follows.

In the embodiment 50 of FIG. 3, light intensity is stabilized by controlling the means 51 for providing a controlled emission of D transition light, whether for the $D_1$ resonance line of the atomic gas or the $D_2$ resonance line of the atomic gas, by effecting simultaneous changes in both laser temperature and laser injection current. If only the temperature of the laser is changed in an attempt to stabilize the light intensity, the optical frequency of the laser will also be altered; likewise, if only the laser injection current is changed in an attempt to stabilize the light intensity, the optical frequency of the laser will also be altered. By themselves, neither is a permissible option since the laser light frequency must be controlled so as to make it coincide with one of the $D_1$ or $D_2$ optical resonance frequencies of the atoms of the atomic gas and also to control the light-shift-coefficient, $k_{LS}$. In the FIG. 3 embodiment, the light intensity is controlled in such a way as not to alter the optical frequency of the laser. The intensity of the light entering cell 27 is stabilized using the same method as is used in the embodiment of FIG. 2 for the electrodeless discharge lamp; namely, the sampled dc light voltage V from photodiode 29 is used to generate an error signal proportional to $\Delta V = V - V_{ref}$, where $V_{ref} = f(T)$, and the error signal is used to correct the temperature set point of the laser heater/thermoelectric device 52a. As in the case of the electrodeless discharge lamp of the FIG. 2 embodiment, the control loop automatically adjusts the temperature of the laser to maintain the light intensity constant. This action, however, also tries to change the light frequency of the laser, but the control loop that locks the laser frequency to the center frequency of the selected one of the $D_1$ or $D_2$ optical resonance frequencies acts to maintain the laser on frequency by changing the laser injection current. This action, then, changes the light intensity and the laser temperature is changed again by the control loop that changes the laser thermostat set point. Thus, the two control loops interact, searching for a temperature-injection current setting such that the light intensity is changed (to effect stabilization), but the laser frequency remains unchanged.

In this type of situation, two problems must be considered. First, does a suitable group of combined setpoints exist within the range of the parameter space of the laser; and, second, will oscillations occur due to the interaction of the two loops?

In resolving the first problem, one type of commercially available semiconductor laser suitable for this application was found to have the following small-signal tuning properties: simultaneous changes in laser injection current $I_j$ and laser output power P with laser temperature $T_L$ of amounts $dP/dT_L = -50 \mu W/°$ C. and $dI_j/dT_L = -0.2$ mA/° C. allow the light intensity to be changed with no change in laser wavelength (frequency). Therefore, the needed range of parameter space exists and is easily accessible.

In resolving the second problem, the loop that locks the laser light frequency to the center frequency of the selected one of the $D_1$ or $D_2$ optical resonance frequencies is a very fast loop (e.g., modulation frequency≈10 kHz), whereas the light intensity loop is very slow (sampling frequency<1 Hz) because it involves temperature changes of a significant thermal mass. In this case, the light intensity changes so slowly that the frequency lock loop is in a quasi-static condition at all times. Oscillations due to interaction of the two loops are thereby highly unlikely.

In the embodiment 60 of FIG. 4, light intensity is stabilized by controlling the means 61 for providing a controlled emission of D transition light, whether for the $D_1$ resonance line or the $D_2$ resonance line of the atomic gas by variable attenuation of the D transition light emitted from the means 61. As illustrated by FIG. 4, the means 61 for controlling the emission of D transition light includes a liquid crystal light attenuator 66. Again, the intensity of the light entering cell 27 is stabilized by using essentially the same method as is used for the embodiments of FIG. 2 and FIG. 3, with the exception that the light-control element is liquid-crystal light attenuator 66 instead of devices, such as the lamp oven 23 or the laser heater 52a, that control the temperature of light sources 22 and 51, respectively.

The control output that is sent to liquid-crystal light attenuator 66 is the output of an integrator whose input is proportional to the difference between the sampled dc light voltage at ambient temperature T and the reference value of dc light voltage computed from the stored polynomial $V_{ref} = f(T)$. The integrator can be implemented digitally and its output converted to an analog signal using a digital to analog converter. These components are located inside digital electronics block 68. This method practiced by the FIG. 4 embodiment differs from the method practiced by the FIG. 3 embodiment in that changes in light intensity do not involve any changes to the laser temperature or injection current. For this reason, the laser temperature is controlled by a conventional thermostat with a fixed set point. A disadvantage of the FIG. 4 method and apparatus is that it requires an additional, expensive optical component (the liquid-crystal light attenuator).

The invention thus provides an improvement in methods and apparatus using optically excited atomic media, such as atomic frequency standards, by providing means for providing a controlled emission of D transition light that is controlled to stabilize the light intensity of the D transition light by an electronic assembly output that uses an input representing ambient temperature, a light intensity-ambient temperature algorithm for ambient temperatures that may affect the intensity of the D transition light generated by the light source, and the light intensity signal from the resonance cell photo detector to provide an output for controlling the means for providing a controlled emission of D transition light to substantially eliminate changes in intensity of the emitted D transition light due to light source aging.

Those skilled in the art will be able to select the electronic components, circuits and programs and to make the electronic assemblies and digital electronics 32, 58, 68 described above to practice the invention. Where the numbers for the elements of FIGS. 2–4 are the same, the elements of FIGS. 2–4 are substantially the same.

The embodiments of FIG. 3 and FIG. 4, using laser light sources, incorporate the invention in classical gas-cell atomic frequency standards, that use the same physics and operating principles as discharge-lamp gas-cell atomic frequency standards, but the invention can also be applied to other types of laser-light-source gas-cell atomic frequency standards, such as those based on coherent population trapping (CPT).

Those skilled in the art will recognize that the invention may be incorporated in embodiments other than the embodiment illustrated and described above. For example, the invention can be applied to other types of gas cell atomic frequency standards, such as those based on CPT, and atomic frequency standard using atomic media, such as atomic beams. Thus, the invention is limited only by the scope of the claims that follow and the prior art.

What is claimed is:

1. An atomic frequency standard, comprising
   means for providing a controlled emission of D transition light;
   a resonant microwave cavity for receipt of the controlled emission of D transition light, including a transparent gas cell containing an atomic gas in the path of the emission of D transition light, a light sensor for sensing the intensity of the D transition light transmitted through the atomic gas and providing a light-intensity signal, and means for injecting microwave energy into the microwave cavity, said microwave cavity being resonant at about the hyperfine transition frequency of the atoms of said atomic gas; and
   an electronic assembly including means for generating a standard frequency and, from said standard frequency, a microwave frequency that is frequency-modulated about the hyperfine transition frequency of said atomic gas for injection into said microwave cavity, said electronic assembly being connected with said light intensity signal and developing from said light intensity signal, an error signal applied to said means for generating a standard frequency to lock said standard frequency to the hyperfine transition frequency of the atomic gas,
   said electronic assembly further including an algorithm relating the light intensity signal to ambient temperature at the time of manufacture of the atomic frequency standard and an input representing ambient temperatures that may affect the emission of D transition light, and providing an output developed from said algorithm, said output representing ambient temperature and said light intensity signal, for correcting the controlled emission of D transition light to substantially eliminate changes due to light intensity aging.

2. The atomic frequency standard of claim 1 wherein said means for providing a controlled emission of D transition light comprises an electrodeless plasma discharge light source, means for exciting said plasma discharge light for the emission of light including D transition light, an optical filter for attenuating unwanted light and substantially passing the D transition light, and a heater for said electrodeless plasma discharge light source, and wherein said output corrects the intensity of the controlled emission of D transition light by varying the temperature of the electrodeless plasma discharge light source with said heater.

3. The atomic frequency standard of claim 1 wherein said means for the controlled emission of D level light comprises a semiconductor laser, a source of an injection current selected for operation of the semiconductor laser to emit a D transition light and modulated in magnitude above and below the selected injection current at an audio frequency sufficiently higher than the modulation frequency of the microwave energy injected into the microwave cavity as to permit reliable separation by the electronic assembly of the effects of the modulations of the injection current of the semiconductor laser and of the microwave energy injected into the microwave cavity, said electronic assembly further including means, operated by light intensity signal, for sensing changes in the selected injection current and for operating said source of injection current to maintain the emission of said D transition light by correcting the injection current of the semiconductor laser.

4. The atomic frequency standard of claim 3 wherein said means for providing a controlled emission of D transition light further comprises a heater for the semiconductor laser, and said output corrects the intensity of the controlled emission of the D transition light by varying the temperature of the semiconductor laser with said heater.

5. The atomic frequency standard of claim 3 wherein said means for providing a controlled emission of D transition light further comprises a variable light attenuator between the semiconductor laser and the transparent gas cell and the output corrects the intensity of the controlled emission of D transition light by varying the attenuation thereof with the variable light attenuator.

6. The atomic frequency standard of claim 1 wherein the input representing ambient temperature is generated from cell-oven heater power by said electronic assembly.

7. In an atomic frequency standard comprising
a source for generating D transition light for exciting an atomic gas, a microwave cavity containing a transparent cell containing the atomic gas in the path of the D transition light, a photo sensor for providing a light intensity signal from the D transition light transmitted by the atomic gas and means for injecting microwave frequencies into said microwave cavity; and an electronic assembly including means for generating a standard frequency and, from said standard frequency, microwave frequencies, including the hyperfine transition frequency of said atomic gas, for injection into the microwave cavity, and means for controlling, from said light intensity signal, said standard frequency;
the improvement wherein said source for generating D transition light comprises means for providing a controlled emission of D transition light, and said electronic assembly further includes means for generating an input representing ambient temperature, a light intensity-ambient temperature algorithm for ambient temperatures that may affect the intensity of the D transition light generated by said source, and means, operated by the light intensity signal of said photo sensor, and by said input representing ambient temperature and by said light intensity-ambient temperature algorithm, for providing an output operating said means for providing a controlled emission of exciting light to stabilize the intensity of the generated D transition light.

8. The atomic frequency standard of claim 7 wherein said means for providing a controlled emission of D transition light comprises an electrodeless plasma discharge light source, means for exciting said plasma discharge light for the emission of light including D transition light, an optical filter for attenuating unwanted light and insubstantially attenuating the D transition light, and a heater for said electrodeless plasma discharge light source, and wherein said output corrects the intensity of the controlled emission of D transition light by varying the temperature of the electrodeless plasma discharge light source with said heater.

9. The atomic frequency standard of claim 7 wherein said means for the controlled emission of D transition light comprises a semiconductor laser, a source of an injection current selected for operation of the semiconductor laser to emit a D transition light and modulated in magnitude above and below the selected injection current at an audio frequency sufficiently higher than the modulation frequency of the microwave energy injected into the microwave cavity as to permit reliable separation by the electronic assembly of the effects of the modulations of the injection current of the semiconductor laser and of the microwave energy injected into the microwave cavity, said electronic assembly further including means, operated by light intensity signal, for sensing changes in the selected injection current and for operating said source of injection current to maintain the emission of the D transition light by correcting the injection current of the semiconductor laser.

10. The atomic frequency standard of claim 9 wherein said means for providing a controlled emission of D transition light further comprises a heater for the semiconductor laser, and said output corrects the intensity of the controlled emission of the D transition light by varying the temperature of the semiconductor laser with said heater.

11. The atomic frequency standard of claim 9 wherein said means for providing a controlled emission of D transition light further comprises a variable light attenuator between the semiconductor laser and the transparent gas cell, and said output corrects the intensity of the controlled emission of D transition light by varying the attenuation thereof with the variable light attenuator.

12. A small atomic frequency standard, comprising
a lamp package including a plasma discharge source of exciting light for an atomic gas including D transition light for the atomic gas, means for exciting the plasma discharge source of exciting light, an optical interference filter for substantially attenuating unwanted light and substantially passing the D transition light, and a heater for said plasma discharge source of exciting light;
a resonator package including a microwave cavity tuned to the hyperfine transition frequency of the atomic gas, a transparent gas cell located in said microwave cavity and containing the atomic gas excitable by the D transition light output of the lamp package, an opening in said microwave cavity allowing D transition light from said lamp package to be directed through the transparent gas cell and atomic gas, a photodiode in said microwave cavity providing an electrical signal related to the intensity of the D transition light that is transmitted through the atomic gas, and means for injecting microwave energy into the microwave cavity; and an electronic assembly comprising a voltage-controlled crystal oscillator for operation at a standard frequency;

means for generating, from the output of the voltage-controlled crystal oscillator, the microwave energy, including energy at the hyperfine transition frequency of the atomic gas, to be injected into the microwave cavity;

means for frequency modulating the microwave energy to be injected into the microwave cavity at an audio frequency;

means for generating, from the electrical signal related to the intensity of the D transition light that is transmitted by the atomic gas, a control output for said voltage controlled crystal oscillator, said control output slaving the voltage controlled crystal oscillator output and the standard frequency to the hyperfine transition frequency of the atomic gas, a stored algorithm relating the electrical signal related to the D transition light intensity from the photodiode to ambient temperatures that may affect the D transition light intensity that is generated by the plasma discharge light source, an input that represents ambient temperatures that may affect the intensity of the D transition light generated by the plasma discharge light source, and an output, generated from the electrical signal from the photodiode, the stored algorithm and the input that represents ambient temperatures, to vary the temperature of the heater for said plasma discharge light source and to stabilize thereby the intensity of the D transition light generated by the plasma discharge source.

13. In an atomic frequency standard comprising a plasma discharge source for generating light, including D transition light for exciting an atomic gas, and means for controlling the temperature of said plasma discharge source of exciting light;

a microwave cavity containing a transparent cell containing the atomic gas, a photo sensor for providing a light intensity signal from the light transmitted by the atomic gas and means for injecting microwave frequencies into said microwave cavity; and means for generating a standard frequency and, from said standard frequency, microwave frequencies, including the hyperfine transition frequency of said atomic gas, for injection into the microwave cavity, and means for controlling, from said light intensity output signal, said standard frequency;

the improvement comprising an optical interference filter for attenuating unwanted light other than the D transition light, means for generating an input representing ambient temperature, a light intensity-ambient temperature algorithm for ambient temperatures that may affect the intensity of the D transition light generated by said plasma discharge source, and means, operated by the light intensity output signal of said photodiode, said input representing ambient temperature and said light intensity-ambient temperature algorithm, for operating said means for controlling the temperature of the plasma discharge light source.

14. A method for stabilizing, in an atomic frequency standard, the intensity of D transition light from a plasma discharge light source for an atomic gas, comprising substantially attenuating unwanted light, but not the D transition light for exciting the atomic gas, and directing the D transition light through the atomic gas;

sensing the intensity of the D transition light that is transmitted by the atomic gas and generating a light voltage;

sensing an ambient temperature that may affect the light intensity of the D transition light generated by the plasma discharge light source and generating an ambient temperature signal;

developing an algorithm of the generated light voltage as a function of ambient temperature at the time of manufacture of the atomic frequency standard and providing therefrom a reference voltage;

using the light voltage, the ambient temperature signal and reference voltage to vary the temperature of the plasma discharge light source and correct for light intensity aging.

15. The method of claim 14 wherein said algorithm is provided from ambient temperatures by measuring light voltage at a plurality of ambient temperatures, and generating, from the measured light voltage at a plurality of ambient temperatures, a polynomial representation of light voltage as a function of ambient temperature and storing the polynomial in the atomic frequency standard for use in operation.

16. A method for stabilizing the intensity of D transition light from a plasma discharge light source in an atomic frequency standard, comprising substantially attenuating unwanted light, but not D transition light, from the atomic gas exciting light and directing the D transition light through an atomic gas;

sensing the intensity of the D transition light that is transmitted by the atomic gas and generating a light intensity signal;

providing an input that represents the ambient temperatures that affect the intensity of the D transition light generated by the plasma discharge light source;

providing an algorithm relating light intensity signals as a function of ambient temperature and providing therefrom a reference signal; and using the light intensity signal, the input representing ambient temperatures and reference signal to vary the temperature of the plasma discharge light source so as to correct for light intensity aging.

17. The method of claim 16 wherein said algorithm is provided from ambient temperatures by measuring light intensity signals at a plurality of ambient temperatures, and generating from the measured light intensity signals at the plurality of ambient temperatures, a polynomial representation of light intensity as a function of ambient temperature and storing the polynomial in the atomic frequency standard for use in operation.

18. The method of claim 16 wherein providing the input that represents the ambient temperatures that affect the intensity of the D transition light comprises monitoring an ambient temperature sensor.

19. The method of claim 16 wherein providing the input that represents the ambient temperatures that affect the intensity of the D transition light comprises monitoring cell-oven heater power generated by the atomic frequency standard.

20. A small atomic frequency standard, comprising a light source for generating D transition light for exciting an atomic gas and a heater for said source of exciting light;

a resonator package including a microwave cavity tuned to the hyperfine transition frequency of the atomic gas, a transparent gas cell located in said microwave cavity and containing the atomic gas excitable by the light output, an opening in said microwave cavity allowing D transition light from said light source to be directed through the transparent gas cell and atomic gas, a photodiode in said microwave cavity providing an electrical signal related to the intensity of the D transition light that is transmitted through the atomic gas, and means for injecting microwave energy into the microwave cavity; and an electronic assembly comprising a voltage-controlled crystal oscillator for operation at a standard frequency;

means for generating, from the output of the voltage-controlled crystal oscillator, the microwave energy, including energy at the hyperfine transition frequency of the atomic gas, to be injected into the microwave cavity;

means for frequency modulating the microwave energy to be injected into the microwave cavity at an audio frequency;

means for generating, from the electrical signal related to the intensity of D transition light that is transmitted by the atomic gas, a control output for said voltage-controlled crystal oscillator, said control output slaving the voltage-controlled oscillator output and the standard frequency to the hyperfine transition frequency of the atomic gas, a stored algorithm relating the electrical signal related to the D transition light intensity from the photodiode to ambient temperatures that affect the D transition light intensity that is generated by the light source, an input that represents ambient temperatures that affect the intensity of the D transition light generated by the light source, and an output, generated from the electrical signal from the photodiode, the stored algorithm and the input that represents ambient temperatures, for stabilizing the intensity of the D transition light directed through said transparent gas cell.

21. The small atomic frequency standard of claim 20 wherein said light source comprises an electrodeless plasma discharge light source, means for exciting the plasma discharge light source, and an optical filter for substantially attenuating unwanted light but not D transition light, and wherein said output stabilizes the intensity of the D transition light generated by said plasma discharge light source and allowed to be directed through the transparent gas cell by varying the temperature of said plasma discharge light source.

22. The small atomic frequency standard of claim 20 wherein said light source is a semiconductor laser source whose light output is controlled to be a selected one of either the $D_1$ resonance light frequency or the $D_2$ resonance light frequency of the atomic gas by a controlled injection current, modulated at a high audio frequency, from an injection current supply and, wherein the electrical signal of the photodiode is synchronously demodulated at said high audio frequency and provides a frequency error signal indicating whether the laser light frequency is more or less than the selected one of the $D_1$ resonance light frequency or $D_2$ resonance light frequency, said frequency error signal controlling said injection current supply to maintain the light output of the semiconductor laser at the selected $D_1$ resonance light frequency or $D_2$ resonance light frequency.

23. The small atomic frequency standard of claim 22 wherein said output stabilizes the intensity of the selected one of the $D_1$ resonance light frequency or $D_2$ resonance light frequency by varying the temperature of the semiconductor laser.

24. The small atomic frequency standard of claim 22 wherein the light source includes a variable light attenuator whose attenuation of the light output of the semiconductor laser is varied by said output.

25. The small atomic frequency standard of claim 19 wherein said input that represents ambient temperatures that may affect the D transition light generated by said light source is generated by monitoring cell-oven heater power in said electronic assembly.

26. The small atomic frequency standard of claim 21 wherein the optical filter is a short-wave-pass filter.

27. The small atomic frequency standard of claim 21 wherein the optical filter is a band-pass filter.

28. A method for stabilizing, in an atomic frequency standard, the intensity of D transition light from a semiconductor laser light source for an atomic gas, comprising directing the D transition light through the atomic gas;

sensing the intensity of the D transition light that is transmitted by the atomic gas and generating a light voltage;

sensing an ambient temperature that may affect the light intensity of the D transition light generated by the semiconductor laser light source and generating an ambient temperature signal;

developing an algorithm of the generated light voltage as a function of ambient temperature at the time of manufacture of the atomic frequency standard and providing therefrom a reference voltage;

using the light voltage, the ambient temperature signal and reference voltage to vary the temperature of the semiconductor laser light source and correct for light intensity aging.

29. The method of claim 28 wherein said algorithm is provided from ambient temperatures by measuring light voltage at a plurality of ambient temperatures, and generating, from the measured light voltage at a plurality of ambient temperatures, a polynomial representation of light voltage as a function of ambient temperature and storing the polynomial in the atomic frequency standard for use in operation.

30. A method for stabilizing the intensity of D transition light from a semiconductor laser light source in an apparatus using an atomic medium, comprising directing the D transition light through the atomic medium;

sensing the intensity of the D transition light that is transmitted by the atomic medium and generating a light voltage;

sensing an ambient temperature that may affect the light intensity of the D transition light generated by the semiconductor laser light source and generating an ambient temperature signal;

developing an algorithm of the generated light voltage as a function of ambient temperature at the time of manufacture of the apparatus and providing therefrom a reference voltage;

using the light voltage, the ambient temperature signal and reference voltage to vary the temperature of the semiconductor laser light source and correct for light intensity aging.

31. The method of claim 30 wherein said algorithm is provided from ambient temperatures by measuring light voltage at a plurality of ambient temperatures, and generating, from the measured light voltage at a plurality of ambient temperatures, a polynomial representation of light voltage as a function of ambient temperature and storing the polynomial in the apparatus for use in operation.

32. A method of simultaneously controlling and maintaining a standard wavelength and a selected intensity of light generated by a semiconductor laser, comprising providing an atomic medium having a standard wavelength to be maintained, providing an injection current for operation of the semiconductor laser and for generation of light of the standard wavelength, providing a selected light intensity to be maintained, modulating the amplitude of the provided injection current at an audio frequency and thereby the wavelength of the light generated by the semiconductor laser, sensing the dc and the ac audio frequency components of the intensity of the light transmitted through the atomic medium and providing outputs of said components, determining, from said ac output, deviations of the semiconductor laser wavelength from the standard wavelength and generating a correction of the provided injection current to maintain generation of light at the standard wavelength while simultaneously determining, from said dc output, deviations of light intensity from the selected light intensity and generating an output for varying the temperature of the semiconductor laser to maintain the intensity of the light from the semiconductor laser at the selected light intensity.

* * * * *